US008348680B2

(12) United States Patent
McClellan et al.

(10) Patent No.: US 8,348,680 B2
(45) Date of Patent: Jan. 8, 2013

(54) DAUGHTER CARD ASSEMBLIES

(75) Inventors: Justin S. McClellan, Camp Hill, PA (US); Jeffrey B. McClinton, Harrisburg, PA (US); James L. Fedder, Etters, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/111,727

(22) Filed: May 19, 2011

(65) Prior Publication Data
US 2012/0295452 A1 Nov. 22, 2012

(51) Int. Cl.
*H01R 12/00* (2006.01)
(52) U.S. Cl. ........................................ 439/79
(58) Field of Classification Search .............. 439/79, 439/80, 378
See application file for complete search history.

(56) References Cited

U.S. PATENT DOCUMENTS

| | | | | |
|---|---|---|---|---|
| 4,134,632 | A | * | 1/1979 | Lindberg et al. ............ 439/79 |
| 4,717,982 | A | * | 1/1988 | Toreson et al. ............ 360/137 |
| 4,881,901 | A | | 11/1989 | Mendenhall et al. |
| 4,952,172 | A | | 8/1990 | Barkus et al. |
| 5,158,471 | A | | 10/1992 | Fedder et al. |
| 5,198,279 | A | * | 3/1993 | Beinhaur et al. ............ 428/99 |
| 5,405,267 | A | * | 4/1995 | Koegel et al. ............ 439/79 |
| 6,010,373 | A | | 1/2000 | Donahue |
| 6,123,554 | A | | 9/2000 | Ortega et al. |
| 6,146,155 | A | * | 11/2000 | Boling et al. ............ 439/79 |
| 6,250,971 | B1 | * | 6/2001 | Chen ............ 439/733.1 |
| 6,315,605 | B1 | | 11/2001 | Billman et al. |

FOREIGN PATENT DOCUMENTS

EP 0 338 318 A1 10/1989
WO 92 15187 9/1992

OTHER PUBLICATIONS

STRADA Whisper* Connector System; Application Specification 114-13282; Nov. 4, 2010 Rev A; 2010 Tyco Electronics Corporation; 16 pgs.
International Search Report, International Application No. PCT/US2012/036877, International Filing Date Aug. 5, 2012.

* cited by examiner

*Primary Examiner* — Phuong Dinh

(57) ABSTRACT

A removable daughter card assembly including a circuit board having a leading edge. The daughter card assembly also includes connector modules that are configured to be mounted to the circuit board proximate to the leading edge. The connector modules face in an insertion direction for engaging corresponding mating connectors when advanced in the insertion direction. The card assembly also includes an elongated stiffener that is configured to be mounted to the circuit board. The stiffener includes a plurality of support walls and a bridge member that couples to each one of the support walls. The support walls are secured to the circuit board. The bridge member extends substantially parallel to and proximate to the leading edge and is dimensioned to prevent bowing along the leading edge. At least two of the support walls comprise alignment features that are configured to engage corresponding guide features of a communication system.

20 Claims, 6 Drawing Sheets

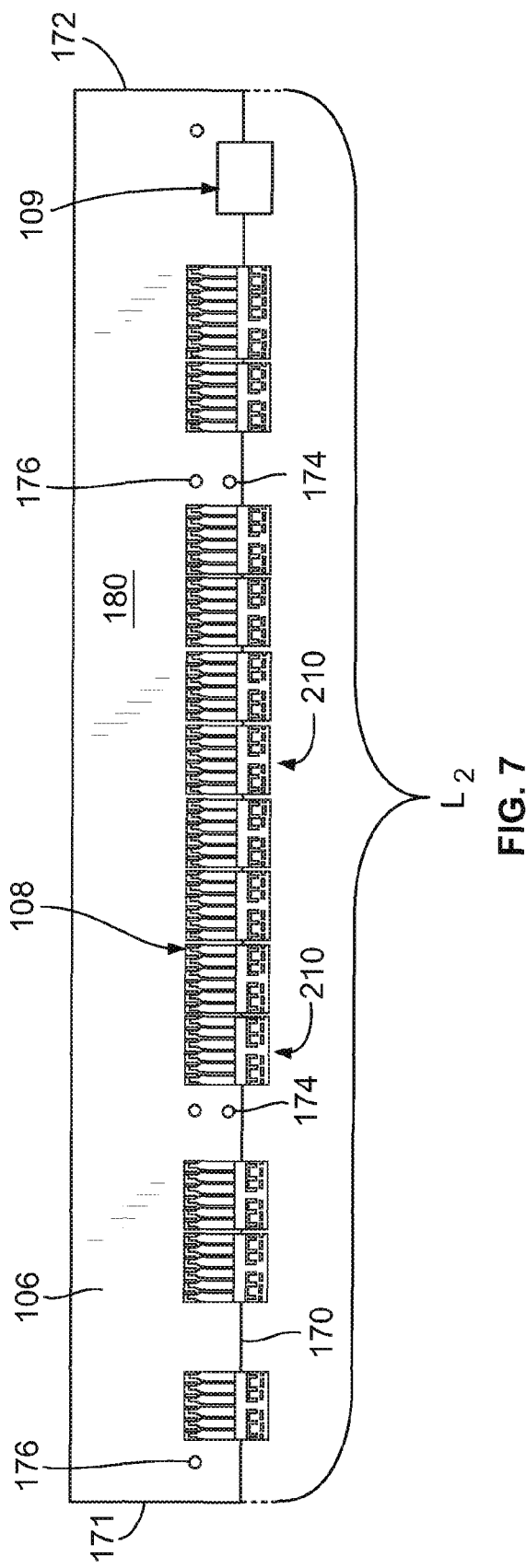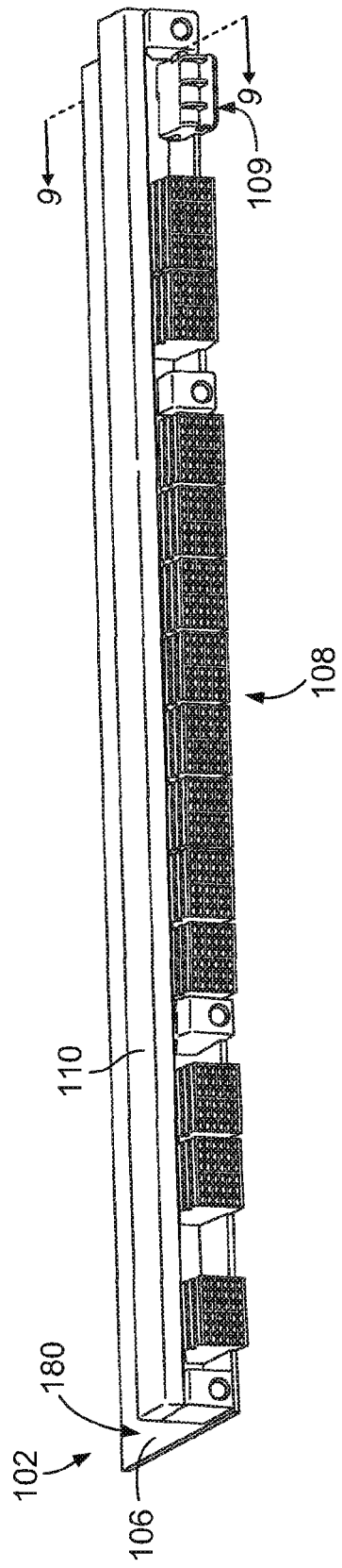
FIG. 7
FIG. 8

DAUGHTER CARD ASSEMBLIES

BACKGROUND OF THE INVENTION

The subject matter herein relates generally to daughter card assemblies in communication systems.

Some communication systems, such as servers, routers, and data storage systems, utilize connector assemblies for transmitting signals and/or power through the system. Such systems may include a midplane circuit board, a motherboard, and a plurality of daughter cards. The systems may also include one or more mating connectors attached to the motherboard that is configured to interconnect a daughter card to the motherboard when the daughter card is inserted into the system. The daughter card includes connector modules that are mounted to a circuit board. The connector modules are configured to engage corresponding mating connectors of the motherboard. The connector modules may be positioned on or near a leading edge of the daughter card. Prior to being mated, the connector modules and the mating connectors are aligned with each other and face each other along a mating axis. The daughter card is then moved along the mating axis until the connector modules and the mating connectors are engaged.

However, in some cases, the circuit board that defines the daughter card on which the connector modules are mounted may bow (or warp) along the leading edge and/or shrink. The bowing and shrinking may occur during the manufacture of the daughter card or during the lifetime operation of the daughter card and may affect the shape and/or effective length of the leading edge. When the circuit board changes due to bowing or shrinking, the position of the connector modules may be affected to such an extent that the connector modules can no longer properly align with the mating connectors. Known daughter cards utilize a stiffener assembly that is coupled to the circuit board and attaches to a back side of each of the connector modules. However, such stiffener assemblies may reduce an amount of available real estate along the daughter card behind the connector modules. Furthermore, known daughter cards may lack suitable mechanisms for aligning the connector modules with the mating connectors.

Accordingly, there is a need for a daughter card assembly that provides a mechanism for aligning the connector modules with the mating connectors without consuming significant space on the daughter card.

BRIEF DESCRIPTION OF THE INVENTION

In one embodiment, a daughter card assembly is provided that includes a circuit board having a pair of side edges and a leading edge that extends between the side edges. The daughter card assembly also includes connector modules that are configured to be mounted to the circuit board proximate to the leading edge. The connector modules face in an insertion direction for engaging corresponding mating connectors when advanced in the insertion direction. The daughter card assembly also includes an elongated stiffener that is configured to be mounted to the circuit board. The stiffener includes a plurality of support walls that are distributed along the leading edge and a bridge member that couples to each one of the support walls. The support walls are secured to the circuit board, wherein the bridge member extends substantially parallel to and proximate to the leading edge and comprises a rigid material that is dimensioned to prevent bowing of the circuit board along the leading edge. At least two of the support walls include alignment features that are configured to engage corresponding guide features of a communication system when moved in the insertion direction into the communication system. The alignment features are sized and shaped relative to the guide features to redirect the connector modules when the connector modules approach the mating connectors in a misaligned manner.

In another embodiment, an elongated stiffener that is configured to be mounted to a circuit board and resist bowing along a leading edge of the circuit board. The stiffener includes an elongated bridge member that extends along a longitudinal axis. The bridge member includes a rigid material and has an interior surface that is configured to extend alongside connector modules. The bridge member has a grounding element that extends away from the interior surface. The stiffener includes a plurality of support walls that are distributed along the longitudinal axis. The bridge member is coupled to each one of the supports walls. At least two of the support walls include alignment features that are configured to engage corresponding guide features of a communication system when moved in an insertion direction into the communication system. The alignment features are sized and shaped relative to the guide features to redirect the support walls when the support walls approach the mating connectors in a misaligned manner.

In another embodiment, a daughter card assembly is provided that includes connector modules that are configured to be mounted to a circuit board proximate to a leading edge of the circuit board. The connector modules are configured to face in an insertion direction when mounted to the circuit board for engaging corresponding mating connectors when advanced in the insertion direction. The daughter card assembly also includes an elongated stiffener that is configured to be mounted to the circuit board. The stiffener includes a plurality of support walls that are positioned to be distributed along the leading edge and a bridge member that couples to each one of the support walls. The support walls are configured to be secured to the circuit board. The bridge member extends along a longitudinal axis and comprises a rigid material that is dimensioned to prevent bowing of the circuit board along the leading edge. At least two of the support walls include alignment features that are configured to engage corresponding guide features of a communication system when moved in the insertion direction into the communication system. The alignment features are sized and shaped relative to the guide features to redirect the connector modules when the connector modules approach the mating connectors in a misaligned manner.

BRIEF DESCRIPTION OF THE DRAWINGS

FIG. 7 is a plan view of the daughter card assembly of FIG. 1 with the stiffener removed therefrom.

FIG. 8 is a front perspective view of the daughter card assembly of FIG. 1.

DETAILED DESCRIPTION OF THE INVENTION

Figure 1:
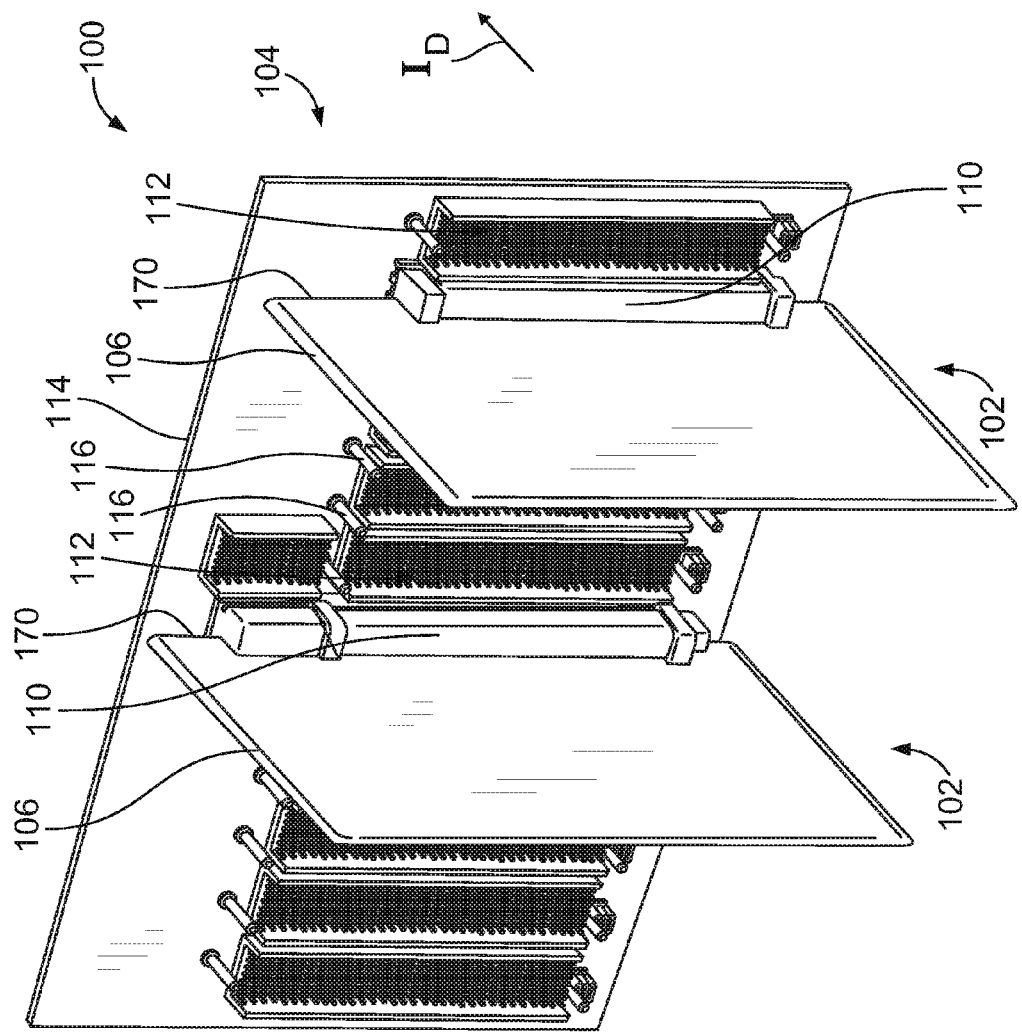
FIG. 1 is a perspective view of a communication system including a daughter card assembly formed in accordance with on embodiment.
Figure 1:
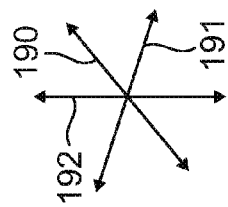

FIG. 1 is a perspective view of a communication system 100 that includes one or more daughter card assemblies 102 and a system assembly 104. As shown in FIG. 1, the communication system 100 and the components thereof are oriented with respect to mutually perpendicular axes 190-192 including a mating axis 190 and orientation axes 191, 192 that define a plane that extends perpendicular to the mating axis 190. In some embodiments, the daughter card assembly 102 includes a circuit board 106 that has a leading edge 170, one or more connector modules 108 (shown in FIG. 5) that are mounted proximate to the leading edge 170, and an elongated stiffener 110 that is mounted to the circuit board 106. The stiffener 110 may extend parallel to and proximate to the leading edge 170 and include a rigid material that is dimensioned to prevent bowing of the circuit board 106 along the leading edge 170. The stiffener 110 may at least partially cover or surround the connector modules 108. The connector modules 108 face in an insertion direction $I_D$ along the mating axis 190. The system assembly 104 may include an electrical component 114 (e.g., circuit board of a backplane or midplane configuration) and one or more mating connectors 112 that are mounted to the electrical component 114 and configured to engage the connector modules 108. The system assembly 104 may also include guide features 116.

The daughter card assembly 102 and the system assembly 104 are configured to be electrically and mechanically coupled to each other during a mating operation. The daughter card assembly 102 may be removable such that the daughter card assembly 102 may be readily engaged and disengaged with the system assembly 104 without damage to either the daughter card assembly 102 or the system assembly 104. During the mating operation, the connector modules 108 are aligned with the mating connectors 112 and advanced in the insertion direction $I_D$ along the mating axis 190. Prior to mating, alignment features 118 (shown in FIG. 2) of the daughter card assembly 102 may engage the guide features 116 of the system assembly 104. The alignment features 118 may be sized and shaped relative to the guide features 116 to redirect the connector modules 108 when the connector modules 108 approach the mating connectors 112 in a misaligned manner. In particular embodiments, the stiffener 110 includes the alignment features 118.

The communication system 100 may be any one of a variety of communication systems, such as a server system, router system, data storage system, and the like. The communication system 100 may also be other types of communication systems that are capable of establishing a communicative connection between a daughter card assembly (or other type of connector assembly) and a system assembly.

Although not shown, the communication system 100 may include a housing or support structure. The mating connectors 112 may be in a stationary position as the daughter card assembly 102 is moved to engage the mating connectors 112. Likewise, the daughter card assembly 102 may also include a housing or cartridge that at least partially surrounds the circuit board 106 and/or connector modules 108. The daughter card assembly 102 is typically configured to be gripped by an individual and inserted into the system assembly 104. However, the daughter card assembly 102 may also be gripped by an automated mechanism that inserts the daughter card assembly 102 into the system assembly 104.

Figure 2:
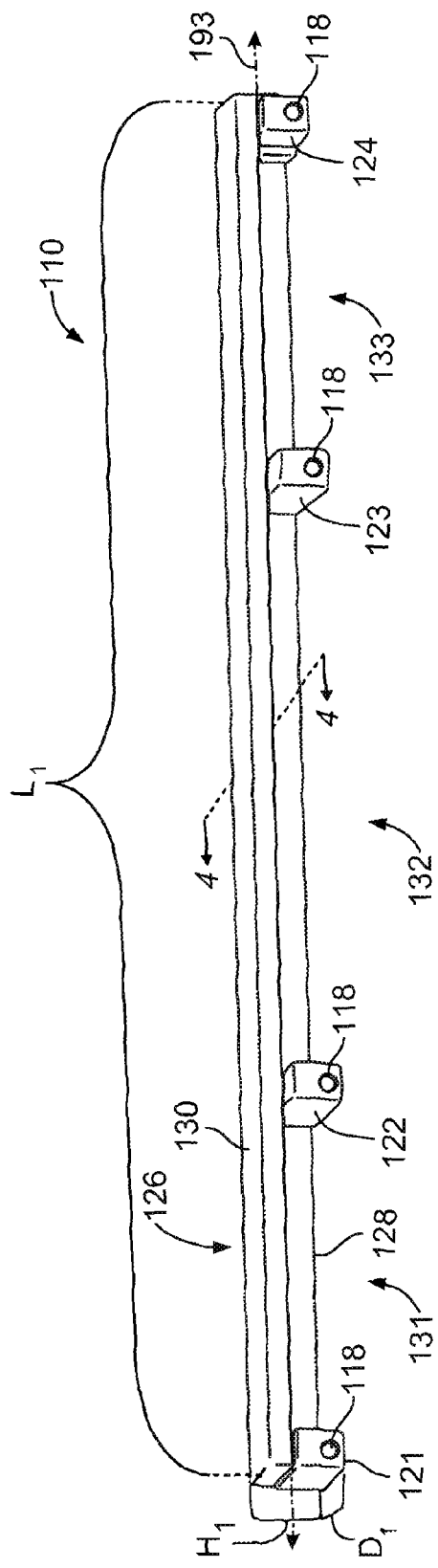
FIG. 2 is a front perspective view of an elongated stiffener formed in accordance with one embodiment that may be used with the daughter card assembly of FIG. 1.
Figure 3:
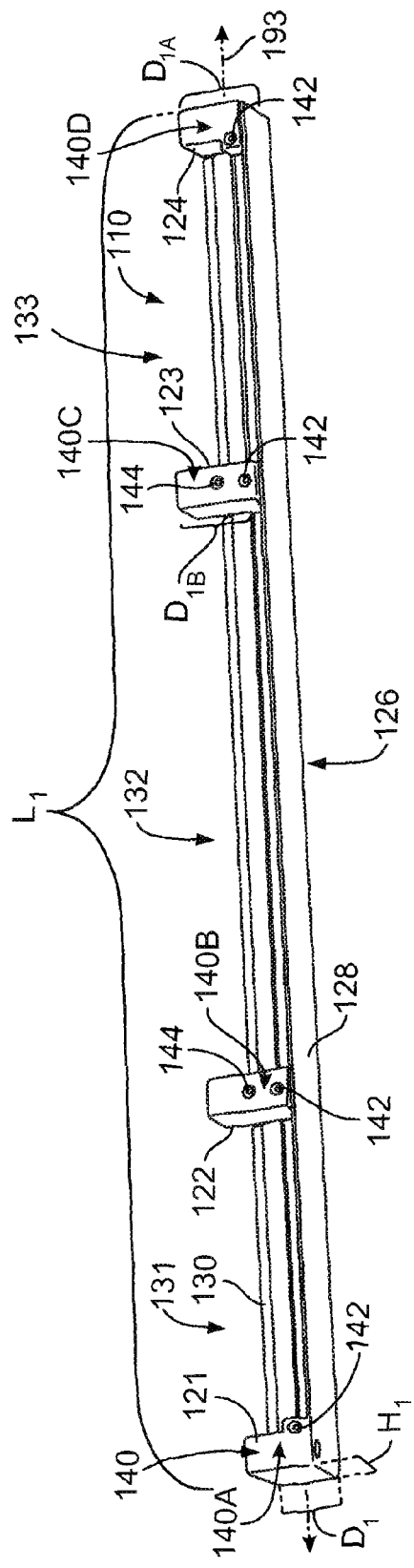
FIG. 3 is a bottom perspective view of the stiffener shown in FIG. 2.

FIGS. 2 and 3 are a front perspective view and a bottom perspective view, respectively, of the stiffener 110. As shown, the stiffener 110 has a first dimension or length $L_1$ that extends along a longitudinal axis 193, a second dimension or height $H_1$, and a third dimension or depth $D_1$. When the stiffener 110 is mounted to the circuit board 106 (FIG. 1), the length $L_1$ also extends along the orientation axis 192 (FIG. 1), the height $H_1$ extends along the orientation axis 191 (FIG. 1), and the depth $D_1$ extends along the mating axis 190 (FIG. 1). The length $L_1$ of the stiffener 110 may be at least partially based upon a length $L_2$ (FIG. 7) of the leading edge 170. For example, the length $L_1$ may be about 75-100% of the length $L_2$. Furthermore, in some embodiments, the stiffener 110 is characterized as an elongated stiffener in that the length $L_1$ is significantly larger than the other dimensions (e.g., the height $H_1$ and the thickness $T_1$). For example, the length $L_1$ may be at least five times greater than the height $H_1$ and/or the depth $D_1$. In more particular embodiments, the length $L_1$ is at least ten times greater than the height $H_1$ and/or the depth $D_1$.

The stiffener 110 may include a plurality of support walls 121-124 and a bridge member 126 that extends between and couples to the support walls 121-124. The bridge member 126 may include elongated sides, such as a base portion 128 and a cover portion 130 that are shown in FIGS. 2 and 3. The base and cover portions 128, 130 may extend lengthwise along the longitudinal axis 193. The base portion 128 and the cover portion 130 extend between and couple to the support walls 121-124. In the illustrated embodiment, the support walls 121-124 include first and second end walls 121 and 124 and two partition walls 122 and 123 that are located between the end walls 121, 124. However, in other embodiments, the support walls may include first and second end walls with only one partition wall therebetween or more than two partition walls therebetween. The support walls may include only two end walls and have no partition walls in between the two end walls. Furthermore, although the bridge member 126 extends between and extends to the each one of the end walls 121, 124 in the illustrated embodiment, the bridge member 126 may extend beyond the end walls 121, 124 in other embodiments. For example, one or both of the base portion 128 and the cover portion 130 may extend beyond the end walls 121, 124.

Also shown in FIGS. 2 and 3, the support walls 121-124 may be distributed along the bridge member 126 such that a substantial space or distance extends between adjacent support walls. For instance, the bridge member 126 and the support walls 121-124 may define a plurality of module recesses 131-133. More specifically, the module recess 131 extends between the end wall 121 and the partition wall 122; the module recess 132 extends between the partition wall 122 and the partition wall 123; and the module recess 133 extends between the partition wall 123 and the end wall 124. Each of the module recesses 131-133 may be sized and shaped to accommodate a plurality of connector modules 108 (FIG. 1).

In the illustrated embodiment, the stiffener 110 is substantially rectangular and the dimensions of the length $L_1$ and the height $H_1$ may be substantially uniform throughout. Also in the illustrated embodiment, the depth $D_1$ may vary with respect to the support walls 121-124. For example, as shown in FIG. 3, the end walls 121, 124 may have a depth $D_{1A}$ and the partition walls 123, 124 may have a depth $D_{1B}$, which is greater than the depth $D_{1A}$. However, in other embodiments, the depth $D_{1A}$ may be greater than the depth $D_{1B}$ or the depths $D_{1A}$ and $D_{1B}$ may be substantially equal. Furthermore, in other embodiments, the height $H_1$ and/or the depth $D_1$ may increase or decrease as the stiffener 110 extends lengthwise in order to accommodate differently sized connector modules.

By way of example, the stiffener 110 may comprise a rigid material and be dimensioned to prevent the circuit board 106 from bowing more than about 2.0 millimeters (mm)/1 meter. In more particular embodiments, the stiffener may be dimensioned to prevent the circuit board 106 from bowing more than about 0.5 millimeters (mm)/1 meter.

Furthermore, in some embodiments, the bridge member 126 and the support walls 121-124 may comprise a single continuous piece of conductive material. For example, a conductive resin or other material may be molded (e.g., die-cast) to include the bridge member 126, the support walls 121-124, and various features thereof. In particular embodiments, the entire stiffener 110 is a single continuous piece of conductive material. In other embodiments, the bridge member 126 and the supports walls 121-124 are machined. Furthermore, in alternative embodiments, the stiffener 110 may comprise separate parts that are attached together to form the stiffener 110.

With reference to FIG. 2, the supports walls 121-124 may include the alignment features 118. In the illustrated embodiment, the alignment features 118 comprise holes that are sized and shaped to receive posts of the guide features 116 (FIG. 1). The holes extend a depth into the corresponding support walls 121-124. However, in other embodiments, the alignment features 118 may be posts and the guide features 116 may be holes that are sized and shaped to receive the posts. Other types of alignment and guide features 118, 116 may be used as well. The alignment features 118 may be generally aligned along the longitudinal axis 193 as shown in FIG. 2, or the alignment features 118 may have non-aligned locations.

With reference to FIG. 3, the stiffener 110 may have a mounting surface 140 that is configured to be mounted to the circuit board 106 (FIG. 1). When mounted to the circuit board 106, the support walls 121-124 extend from a board surface 180 (FIG. 7) of the circuit board 106 to the cover portion 130. The mounting surface 140 may be a continuous surface that extends along a significant portion of the stiffener 110 or the entire stiffener 110. For example, the mounting surface 140 may extend along each one of the support walls 121-124 and the base portion 128. However, in the illustrated embodiment, the mounting surface 140 may comprise a plurality of separate mounting surfaces 140A-D as shown in FIG. 3. For example, each of the support walls 121-124 may have a respective mounting surface 140A-140D that is configured to be mounted to the circuit board 106. The mounting surface 140 may extend along a plane that is parallel to the longitudinal axis 193. In such embodiments where there are separate mounting surfaces 140A-D, the mounting surfaces 140A-D may extend along a common plane that is parallel to the longitudinal axis 193.

Also shown, the stiffener 110 may include fastening elements 142 and retention features 144 along the mounting surface 140. In the illustrated embodiment, the fastening elements 142 comprise holes that are configured to receiving fasteners (e.g., screws or plugs) that facilitate securing the stiffener 110 to the circuit board 106. In alternative embodiments, the fastening elements 142 may comprise plugs or other structures that facilitate securing the circuit board 106 and the stiffener 110 together. The retention features 144 comprise projections that extend away from the mounting surface 140. In some embodiments, the retention features 144 are molded (e.g., die-cast) with the bridge member 126 and the support walls 121-124. In particular embodiments, the retention features 144 and the fastening elements 142 are molded with the bridge member 126 and the support walls 121-124.

Figure 4:
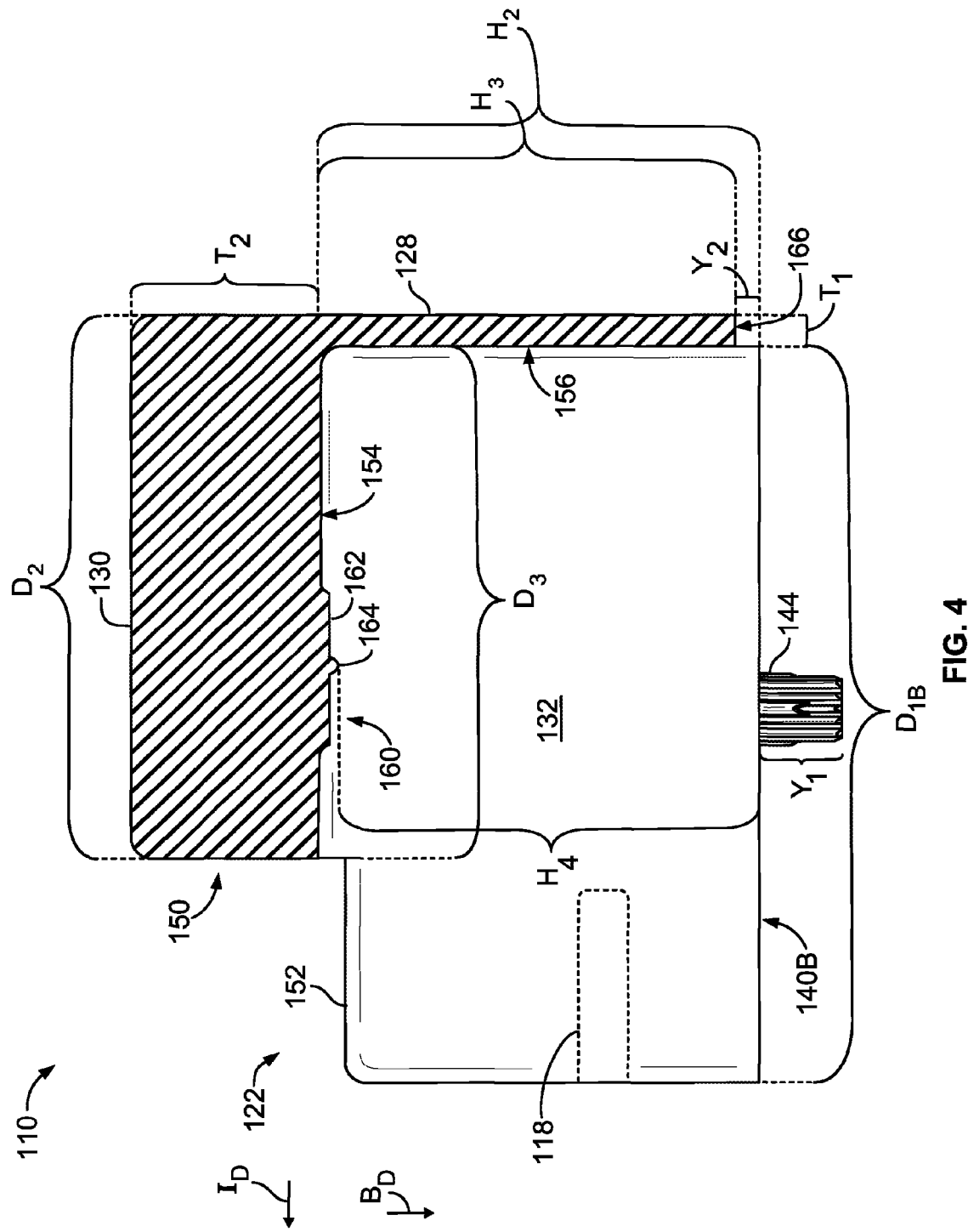
FIG. 4 is a cross-section of the stiffener taken along the lines 4-4 of FIG. 2.

FIG. 4 is a cross-section of the stiffener 110 taken along the lines 4-4 in FIG. 2 through the module recess 132. Although the following description is with specific reference to the module recess 132, the description may be similarly applied to the module recesses 131, 133. As shown, the cover portion 130 has a depth $D_2$ and the partition wall 122 has the depth $D_{1B}$. The depth $D_{1B}$ is greater than the depth $D_2$. As such, the partition wall 122 extends beyond a mating face 150 of the cover portion 130. More specifically, the partition wall 122 may have a wall extension 152 that extends beyond the cover portion 130. The alignment feature 118 of the partition wall 122 may engage the guide feature 116 (FIG. 1) of the system assembly 104 before other components of the daughter card assembly 102 (FIG. 1).

Also shown, the cover portion 130 includes an interior surface 154, and the base portion 128 includes an interior surface 156. The interior surface 156 faces in the insertion direction $I_D$ when the stiffener 110 is mounted to the circuit board 106 (FIG. 1), and the interior surface 154 faces in a board direction $B_D$ that is substantially perpendicular to the insertion direction $I_D$. The interior surface 154 faces toward the circuit board 106 when the stiffener 110 is mounted thereon. The interior surfaces 154, 156 and the partition walls 122, 123 (FIG. 2) define the module recess 132. The module recess 132 may be sized and shaped relative to the connector modules 108 (FIG. 1) such that at least a portion of the connector modules 108 are enclosed by the stiffener 110 within the module recess 132. As shown, the module recess 132 has a height $H_2$ measured from the interior surface 154 to the mounting surface 140B and a depth $D_3$ measured from the mating face 150 to the interior surface 156. Also shown, the retention feature 144 extends from the mounting surface 140B of the partition wall 122 in the board direction $B_D$. The retention feature 144 may extend a distance $Y_1$ away from the mounting surface 140B.

The stiffener 110 may also include a grounding element 160 that is configured to electrically and mechanically engage the connector modules 108 within the module recess 132. In the illustrated embodiment, the grounding element 160 projects from the interior surface 154 in the board direction $B_D$. Alternatively or additionally, a grounding element that is similar to the grounding element 160 may project from the interior surface 156 in the insertion direction $I_D$. The grounding element 160 includes a platform portion 162 and a protuberance 164 that extends from the platform portion 162 in the board direction $B_D$. A height $H_4$ of the module recess 132 is measured from the grounding element 160 (or the protuberance 164) to the mounting surface 140B.

Also shown in FIG. 4, the base portion 128 of the stiffener 110 may have a thickness $T_1$ and a height $H_3$. The thickness $T_1$ may be thin or substantially small to reduce the volume of the base portion 128 that is behind the connector modules 108. The base portion 128 may extend from the interior surface 154 toward the circuit board 106. An edge 166 of the base portion 128 may be offset from the mounting surface 140 by a distance $Y_2$. The offset may be configured to receive another component (not shown) of the daughter card assembly 102, such as an insulator. Also shown, the cover portion 130 may have a thickness $T_2$. The thickness $T_2$ and the height $H_3$ are measured along the board direction $B_D$. In particular embodiments, the thickness $T_2$, the thickness $T_1$, and the height $H_3$ are dimensioned such that the stiffener 110 is sufficiently rigid to prevent bowing of the circuit board 106.

Figure 5:
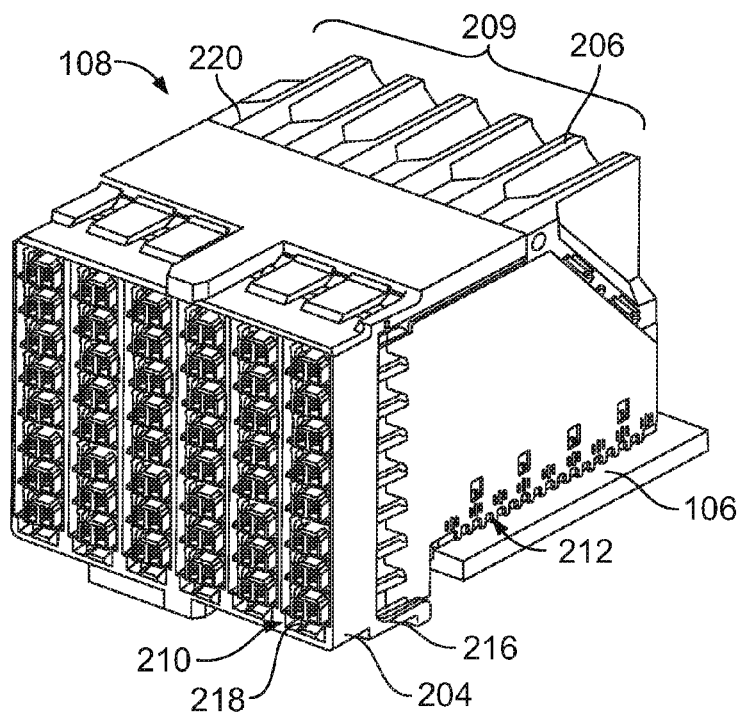
FIG. 5 is a perspective view of an exemplary connector module that may be used with the daughter card assembly of FIG. 1.

FIG. 5 is an isolated perspective view of one of the connector modules 108. In the illustrated embodiment, the connector module 108 may be similar to STRADA Whisper connectors that are manufactured by Tyco Electronics. However, other types of electrical connectors may be used. As shown in FIG. 5, the connector module 108 includes a front housing 204 and a plurality of contact assemblies 206 received within the front housing 204. The contact assemblies 206 hold a plurality of contacts 208 (shown in FIG. 6) that are configured to be mated to a corresponding mating connector 112 (FIG. 1) and terminated to the circuit board 106 (FIG. 5). The connector module 108 has a mating interface 210 that is configured to be mated with the mating connector 112. The connector module 108 also has a mounting interface 212 that is configured to be mounted to the circuit board 106. The connector module 108 may have a connector housing 209. The connector housing 209 may be a single structure or comprise a series of ground or shield bodies 220 (shown in FIG. 6). Also shown in FIG. 5, the front housing 204 has a plurality of contact channels 218 extending therethrough. The contact assemblies 206 are loaded into the front housing 204 through a back side 216 of the front housing 204.

In the illustrated embodiment, the connector module 108 is a type of right-angle connector in which the mating and mounting interfaces 210, 212 may be perpendicular to one another. However, other connector orientations or configurations (e.g., vertical connectors) may be used in alternative embodiments.

Figure 6:
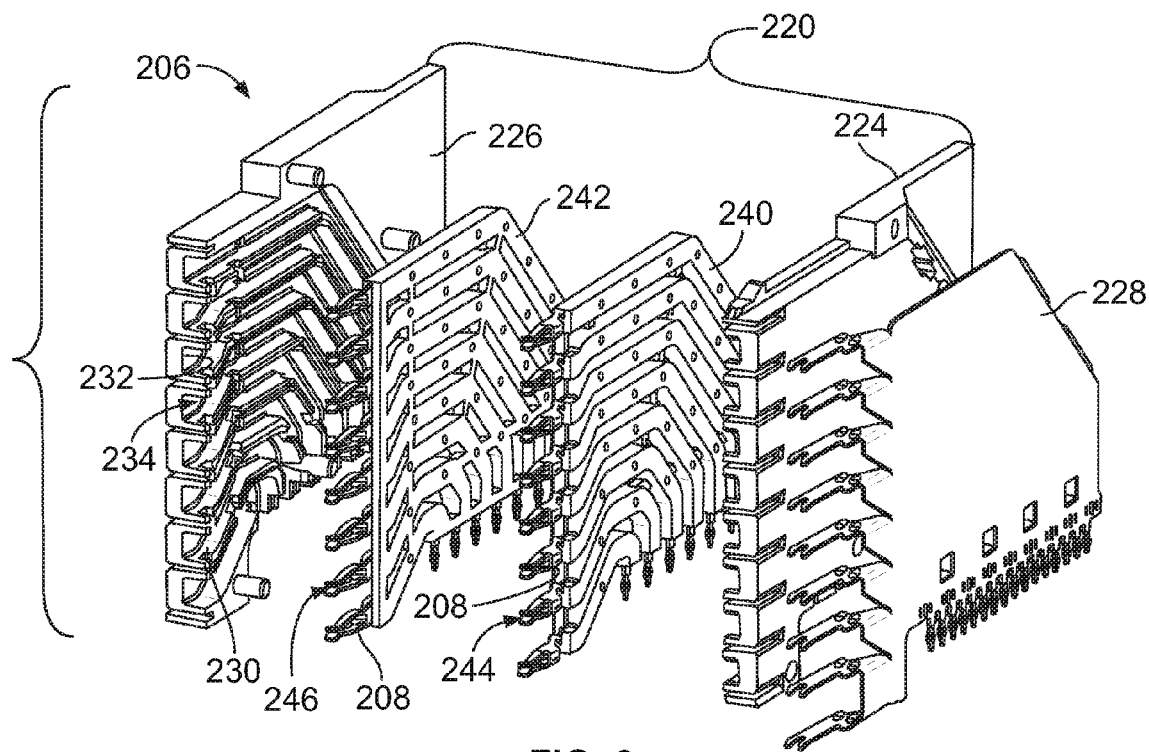
FIG. 6 is an exploded view of the connector module shown in FIG. 5.

FIG. 6 is an exploded view of one of the contact assemblies 206 that may be used in the connector module 108 (FIG. 1). The contact assembly 206 has a ground body 220 for providing electrical grounding for the contacts 208. The ground body 220 may also provide shielding from electromagnetic interference (EMI) and/or radio-frequency interference (RFI). The ground body 220 may provide shielding from other types of interference as well.

In an exemplary embodiment, the ground body 220 includes a first holder member 224 and a second holder member 226 that are coupled together. The ground body 220 may also include a ground panel 228 that may be coupled to the first holder member 224 and/or the second holder member 226. The first and second holder members 224, 226, as well as the ground panel 228, may constitute the ground body 220. The first and second holder members 224, 226 and the ground panel 228 cooperate to provide electrical shielding around the contacts 208 and/or grounding.

The holder members 224, 226 may be fabricated from a conductive material. For example, the holder members 224, 226 may be die cast from a conductive material. In other embodiments, the holder members 224, 226 may be stamped and formed or may be fabricated from a plastic material that has been metalized or coated with a conductive layer. By having the holder members 224, 226 fabricated from a conductive material, the holder members 224, 226 may provide electrical shielding and/or grounding for the contact assemblies 206. Also shown, the holder members 224, 226 include tabs 230 extending inward from side walls 232 thereof. The tabs 230 define channels 234 therebetween.

The ground panel 228 is configured to be coupled the first holder member 224 and may be electrically connected to the circuit board 106 (FIG. 5) to electrically common the ground body 220 to a ground plane of the circuit board 106. The ground panel 228 engages ground body 220 or the holder member 224 to electrically common the contact assembly 206 with the ground plane of the circuit board 106. In addition, as will be described in greater detail below, the stiffener 110 (FIG. 1) may be electrically connected to the connector housing 209 (FIG. 5) through at least one of the contact assemblies 206.

The contact assembly 206 includes a pair of dielectric frames 240, 242 surrounding the contacts 208. In an exemplary embodiment, some of the contacts 208 are initially held together as a lead frame 244, which is overmolded with a dielectric material to form the dielectric frame 240. Other contacts 208 are initially held together as a lead frame 246, which may be substantially similar to the lead frame 244. The lead frame 246 is overmolded with a dielectric material to form the dielectric frame 242. The dielectric frames 240, 242 are held in the holder members 224, 226, respectively. The holder members 224, 226 provide shielding around the dielectric frames 240, 242 and the contacts 208 encased by the dielectric frames 240, 242.

FIG. 7 is a plan view of the circuit board 106 having the connector modules 108 mounted thereon. As shown, the circuit board 106 includes the leading edge 170 and a pair of side edges 171-172. A board surface 180 of the circuit board 106 extends between the edges 170-172. The leading edge 170 extends between the side edges 171-172 and has the length $L_2$. Although paths of the edges 170-172 are substantially linear in the illustrated embodiment, the edges 170-172 may have non-linear paths. Also shown in FIG. 7, the circuit board 106 may include positioning features 174 and fastening features 176. The positioning features 174 are located to align with the retention features 144 (FIG. 3) of the stiffener 110. The fastening features 176 are located to align with the fastening elements 142 (FIG. 3).

Also shown in FIG. 7, the connector modules 108 may be located proximate to the leading edge 170. In addition to the connector modules 108, there may be other connector modules along the leading edge 170, such as the connector module 109. As used herein, the phrase "proximate to the leading edge" includes the connector modules 108 extending over and beyond the leading edge 170 as shown in FIG. 7; includes the mating interfaces 210 of the connector modules 108 extending to the leading edge 170 such that the mating interfaces 210 are substantially even or flush with the leading edge 170; and the mating interfaces 210 being located near, but offset from the leading edge 170 such that the leading edge 170 is within about 5, 10, or 20 mm from the mating interfaces 210. The connector module 109 may also be located proximate to the leading edge 170 as described above with respect to the connector modules 108.

Figure 9:
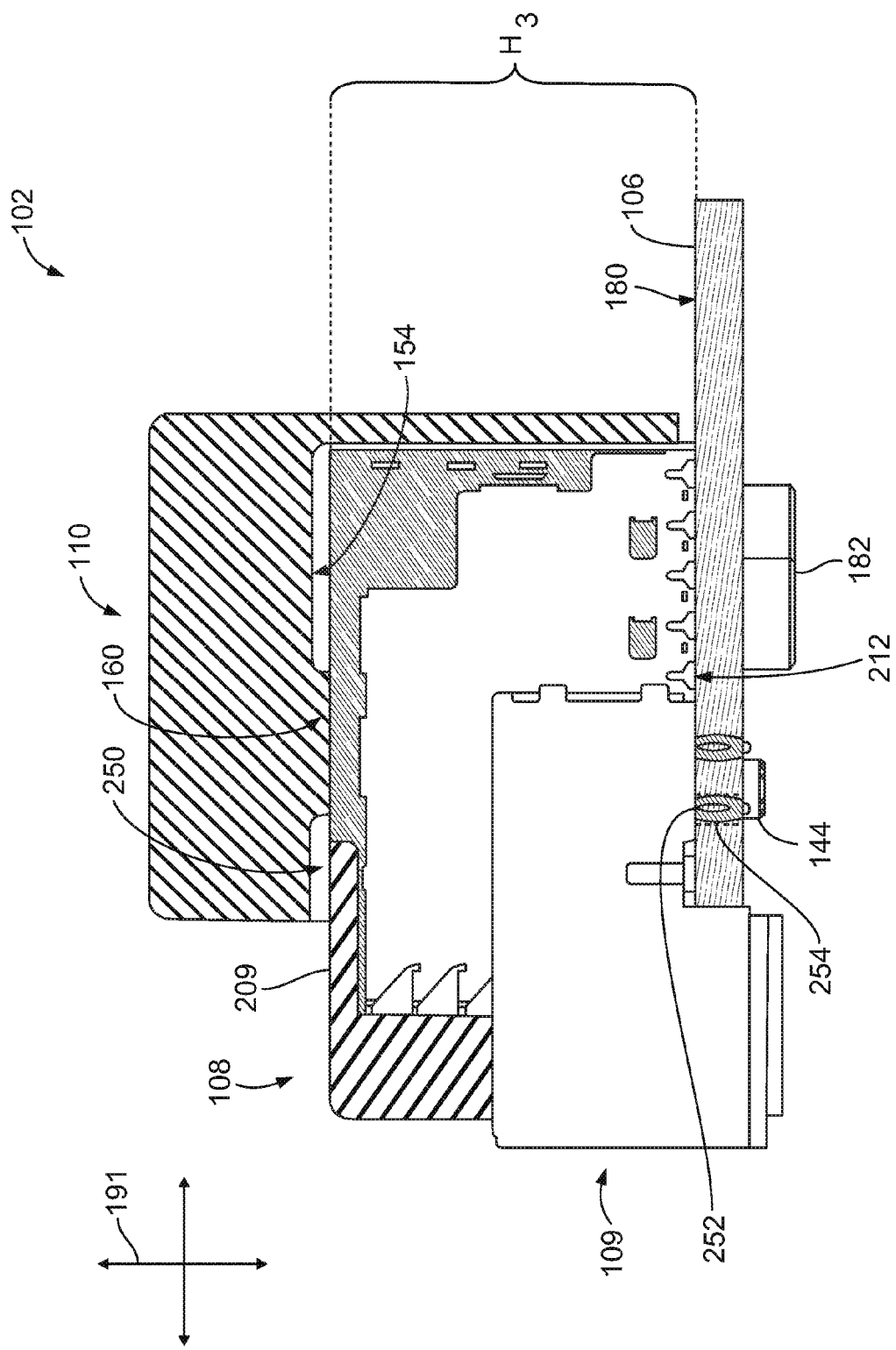
FIG. 9 is a cross-section of the daughter card assembly taken along the lines 9-9 in FIG. 8.

FIG. 8 is a front perspective view of the daughter card assembly 102, and FIG. 9 is a cross-section of the daughter card assembly 102. In the exemplary embodiment, the connector modules 108 include mating contacts 252 (FIG. 9) that are compliant and configured to be press-fit into corresponding thru-holes 254 (FIG. 9) of the circuit board 106. For example, the mating contacts 252 may be eye-of-needle contacts. As such, the connector modules 108 may be mounted to the circuit board 106 without soldering.

After the connector modules 108, 109 have been mounted to the circuit board 106, the stiffener 110 may be mounted to the circuit board 106 thereby enclosing at least a portion of the connector modules 108, 109. More specifically, the mounting surface 140 (FIG. 3) may be mounted to the board surface 180 of the circuit board 106. For example, the stiffener 110 may be placed onto the circuit board 106 such that the retention features 144 (FIG. 9) engage corresponding positioning features 174 (FIG. 7) of the circuit board 106. When the retention features 144 are aligned with and advanced into the positioning features 174, the retention features 144 and the positioning features 174 may provide a tactile indication that the stiffener 110 has been moved into a predetermined position. Fasteners 182 (FIG. 9) may then be inserted through the fastening features 176 (FIG. 7) of the circuit board 106 and through the fastening elements 142 (FIG. 3) of the stiffener 110 to secure the stiffener 110 to the circuit board 106.

As shown in FIG. 9, the connector module 108 may have a grounding interface 250 that interfaces with the interior surface 154 and/or the grounding element 160. The connector module 108 may have a height $H_5$ that is measured from the mounting interface 212 to the grounding interface 250 along the orientation axis 191. The mounting interface 212 and the grounding interface 250 face in opposite directions along the orientation axis 191. In some embodiments, the height $H_4$ (FIG. 4) and the height $H_5$ are configured so that the grounding element 160 presses against and makes sufficient contact with the grounding interface 250 for grounding the connector module 108. In particular embodiments, the height $H_4$ is smaller than the height $H_5$. For example, the height $H_4$ may be about 19.5 mm and the height $H_5$ may be about 20.4 mm. In such embodiments, when the fasteners 182 secure the stiffener 110 to the circuit board 106, the grounding element 160 may press against the grounding interface 250 such that the connector housing 209 is mechanically deformed or crushed by the grounding element 160. For example, one or more of the ground bodies 220 of the contact assemblies 206 (FIG. 6) may be mechanically deformed or crushed. Accordingly, the stiffener 110 may be configured to prevent the circuit board 106 from bowing, compress the connector modules 108 into the circuit board 106 and electrically ground the connector modules 108, and include alignment features 118 for aligning the connector modules 108.

In the illustrated embodiment, the grounding element 160 is continuous and extends along the entire module recess 132. Alternatively, the grounding element 160 may include a plurality of grounding elements 160 that are located at predetermined positions. Such grounding elements 160 may press against corresponding connector modules 108. Each one of the grounding elements 160 could be configured to mechanically deform a connector housing 209 of the corresponding connector module 108.

It is to be understood that the above description is intended to be illustrative, and not restrictive. In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A daughter card assembly comprising:
   a circuit board having a pair of side edges and a leading edge that extends between the side edges;
   connector modules mounted to the circuit board proximate to the leading edge, the connector modules facing in an insertion direction for engaging corresponding mating connectors when advanced in the insertion direction; and
   an elongated stiffener mounted to the circuit board, the stiffener comprising a plurality of support walls that are distributed along the leading edge and a bridge member that extends between and couples to the support walls, the support walls being secured to the circuit board, wherein the bridge member extends substantially parallel to and proximate to the leading edge, the bridge member including a rigid material that is dimensioned to prevent bowing of the circuit board along the leading edge;
   wherein at least two of the support walls comprise alignment features that are configured to engage corresponding guide features of a communication system when moved in the insertion direction into the communication system, the alignment features being sized and shaped relative to the guide features to redirect the connector modules when the connector modules approach the mating connectors in a misaligned manner.

2. The daughter card assembly of claim 1, wherein the connector modules have respective conductive connector housings for providing electrical grounding for the connector modules, the bridge member including a grounding element that presses against the connector housings to ground the connector modules.

3. The daughter card assembly of claim 2, wherein the bridge member has an interior surface and the circuit board has a board surface that faces the interior surface, the grounding element extending from the interior surface to the connector housings.

4. The daughter card assembly of claim 2, wherein the grounding element mechanically deforms the connector housings of the connector modules when pressed against the connector housings.

5. The daughter card assembly of claim 2, wherein the grounding element comprises a plurality of grounding elements.

6. The daughter card assembly of claim 1, wherein the stiffener includes a mounting surface that interfaces with the circuit board, the mounting surface including retention features that engage corresponding positioning features of the circuit board to retain the stiffener in a predetermined position, the retention and positioning features providing a tactile indication when the stiffener is moved into the predetermined position.

7. The daughter card assembly of claim 1, wherein the support walls include first and second end walls and a partition wall located between the first and second end walls, at least one of the connector modules being between the first end wall and the partition wall and at least one of the connector modules being between the second end wall and the partition wall.

8. The daughter card assembly of claim 1, wherein the connector modules extend beyond the leading edge of the circuit board in the insertion direction, at least one of the support walls extending beyond the leading edge in the insertion direction.

9. The daughter card assembly of claim 1, wherein the bridge member comprises a base portion and a cover portion, the base portion having an interior surface that faces in the insertion direction and the cover portion having an interior surface that faces the circuit board, the cover portion and the base portion defining a module recess where the connector modules are located.

10. The daughter card assembly of claim 1, wherein the bridge member includes a cover portion that extends between and couples to the support walls, the support walls extending from a board surface of the circuit board to the cover portion.

11. The daughter card assembly of claim 1, wherein the stiffener is a single continuous structure comprising a molded conductive material.

12. An elongated stiffener configured to be mounted to a circuit board and resist bowing along a leading edge of the circuit board, the stiffener comprising:
    an elongated bridge member extending along a longitudinal axis, the bridge member including a rigid material and having an interior surface configured to extend alongside connector modules, the bridge member having a grounding element that extends from the interior surface; and
    a plurality of support walls that are distributed along the longitudinal axis, the bridge member coupled to each one of the supports walls;
    wherein at least two of the support walls comprise alignment features that are configured to engage corresponding guide features of a communication system when moved in an insertion direction into the communication system, the alignment features being sized and shaped relative to the guide features to redirect the support walls when the support walls approach mating connectors in a misaligned manner.

13. The stiffener of claim 12, wherein the stiffener includes a mounting surface that is configured to interface with the circuit board, the mounting surface including retention features that are configured to engage corresponding positioning features of the circuit board to retain the stiffener in a predetermined position.

14. The stiffener of claim 12, wherein at least one of the support walls extends beyond the bridge member in the insertion direction.

15. The stiffener of claim 12, wherein the bridge member comprises a base portion and a cover portion, the base portion having an interior surface that is configured to face in an insertion direction and the cover portion having an interior surface that is configured to face in a direction that is substantially perpendicular to the insertion direction, the cover portion and the base portion defining a module recess where the connector modules are to be positioned.

16. The stiffener of claim 12, wherein the stiffener is a single continuous structure comprising a molded conductive material.

17. The stiffener of claim 12, wherein the grounding element includes a platform portion and a protuberance that extends from the platform portion.

18. A daughter card assembly comprising:
    connector modules configured to be mounted to a circuit board proximate to a leading edge of the circuit board, the connector modules configured to face in an insertion direction when mounted to the circuit board for engaging corresponding mating connectors when advanced in the insertion direction; and
    an elongated stiffener configured to be mounted to the circuit board, the stiffener comprising a plurality of support walls that are positioned to be distributed along the leading edge and a bridge member that couples to each one of the support walls, the support walls configured to be secured to the circuit board, wherein the bridge member extends along a longitudinal axis and comprises a rigid material that is dimensioned to prevent bowing of the circuit board along the leading edge;
    wherein at least two of the support walls comprise alignment features that are configured to engage corresponding guide features of a communication system when moved in the insertion direction into the communication system, the alignment features being sized and shaped relative to the guide features to redirect the connector modules when the connector modules approach the mating connectors in a misaligned manner.

19. The daughter card assembly of claim 18, wherein the connector modules have respective conductive connector housings for providing electrical grounding for the connector modules, the bridge member including a grounding element that presses against the connector housings to ground the connector modules.

20. The daughter card assembly of claim 18, further comprising the circuit board.

* * * * *